United States Patent
An et al.

(10) Patent No.: US 10,451,937 B2
(45) Date of Patent: Oct. 22, 2019

(54) ARRAY SUBSTRATE AND DISPLAY PANEL

(71) Applicant: Shenzhen China Star Optoelectronics Technology Co., Ltd., Shenzhen, Guangdong (CN)

(72) Inventors: Liyang An, Guangdong (CN); Xiangyang Xu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 5 days.

(21) Appl. No.: 15/736,313

(22) PCT Filed: Nov. 8, 2017

(86) PCT No.: PCT/CN2017/110003
§ 371 (c)(1),
(2) Date: Dec. 14, 2017

(87) PCT Pub. No.: WO2019/061692
PCT Pub. Date: Apr. 4, 2019

(65) Prior Publication Data
US 2019/0101799 A1 Apr. 4, 2019

(30) Foreign Application Priority Data
Sep. 30, 2017 (CN) .......................... 2017 1 0924613

(51) Int. Cl.
*G02F 1/1362* (2006.01)
*H01L 27/12* (2006.01)
(Continued)

(52) U.S. Cl.
CPC .. *G02F 1/136209* (2013.01); *G02F 1/134336* (2013.01); *G02F 1/136286* (2013.01);
(Continued)

(58) Field of Classification Search
CPC ......... G02F 1/134336; G02F 1/136286; G02F 1/136209; H01L 29/78633; H01L 27/124
See application file for complete search history.

(56) References Cited

U.S. PATENT DOCUMENTS 9,318,040 B1* 4/2016 Tsai .................. G02F 1/136286
2016/0266452 A1* 9/2016 Xu .................... G02F 1/133512
(Continued)

FOREIGN PATENT DOCUMENTS

| CN | 201289561 Y | 8/2009 |
|---|---|---|
| CN | 103926757 A | 7/2014 |

(Continued)

*Primary Examiner* — Bilkis Jahan
*Assistant Examiner* — Victor V Barzykin
(74) *Attorney, Agent, or Firm* — Andrew C. Cheng (57) ABSTRACT

An array substrate includes multiple gate lines, multiple data lines, and multiple light-shielding electrode lines. The multiple gate lines and the multiple data lines intersect each other to circumferentially delimit a plurality of sub pixels. The multiple light-shielding electrode lines are arranged to correspond to the multiple data lines. The plurality of sub pixels includes a blue sub pixel column corresponding to a blue color filter. At least one sub pixel of the blue sub pixel column includes a light-shielding electrode. The light-shielding electrode is connected to light-shielding electrode lines that are located on two opposite sides of the blue sub pixel column. Displaying abnormality that occurs in displaying pure blue or pure yellow images can be avoided. Also provided is a display panel.

18 Claims, 5 Drawing Sheets

(51) Int. Cl.
*H01L 29/786* (2006.01)
*G02F 1/1343* (2006.01)
*G02F 1/1333* (2006.01)

(52) U.S. Cl.
CPC ...... *H01L 27/124* (2013.01); *H01L 29/78633* (2013.01); *G02F 2001/133397* (2013.01); *G02F 2001/134318* (2013.01); *G02F 2001/134345* (2013.01); *G02F 2201/121* (2013.01); *G02F 2201/52* (2013.01)

(56) References Cited

U.S. PATENT DOCUMENTS

| | | | |
|---|---|---|---|
| 2017/0285418 A1* | 10/2017 | Tanaka | G02F 1/134336 |
| 2018/0095314 A1* | 4/2018 | Cheng | G09G 3/3655 |
| 2018/0151120 A1* | 5/2018 | Kim | G09G 3/3258 |
| 2018/0341354 A1* | 11/2018 | Guo | G06F 3/0412 |

FOREIGN PATENT DOCUMENTS

| | | |
|---|---|---|
| CN | 104007591 A | 8/2014 |
| CN | 105425482 A | 3/2016 |
| CN | 106842684 A | 6/2017 |
| KR | 20150021323 A | 3/2015 |

* cited by examiner

ARRAY SUBSTRATE AND DISPLAY PANEL

CROSS REFERENCE TO RELATED APPLICATIONS

This application claims the priority of Chinese Patent Application No. 201710924613.8 filed on Sep. 30, 2017, titled "Array Substrate and Display Panel", the disclosure of which is incorporated herein by reference in its entirety.

BACKGROUND OF THE INVENTION

1. Field of the Invention

The present invention relates to the field of display technology, and more particularly to an array substrate and a display panel.

2. The Related Arts

Data Line BM Less (DBS) pixel is generally structured to use a light-shielding electrode line (Com ITO) to substitute a black matrix (BM) arranged above a data line to shield light in order to overcome issues related to light leaking caused by alignment error between a black matrix provided on a color filter (CF) substrate and a data line provided on an array substrate.

Figure 1:
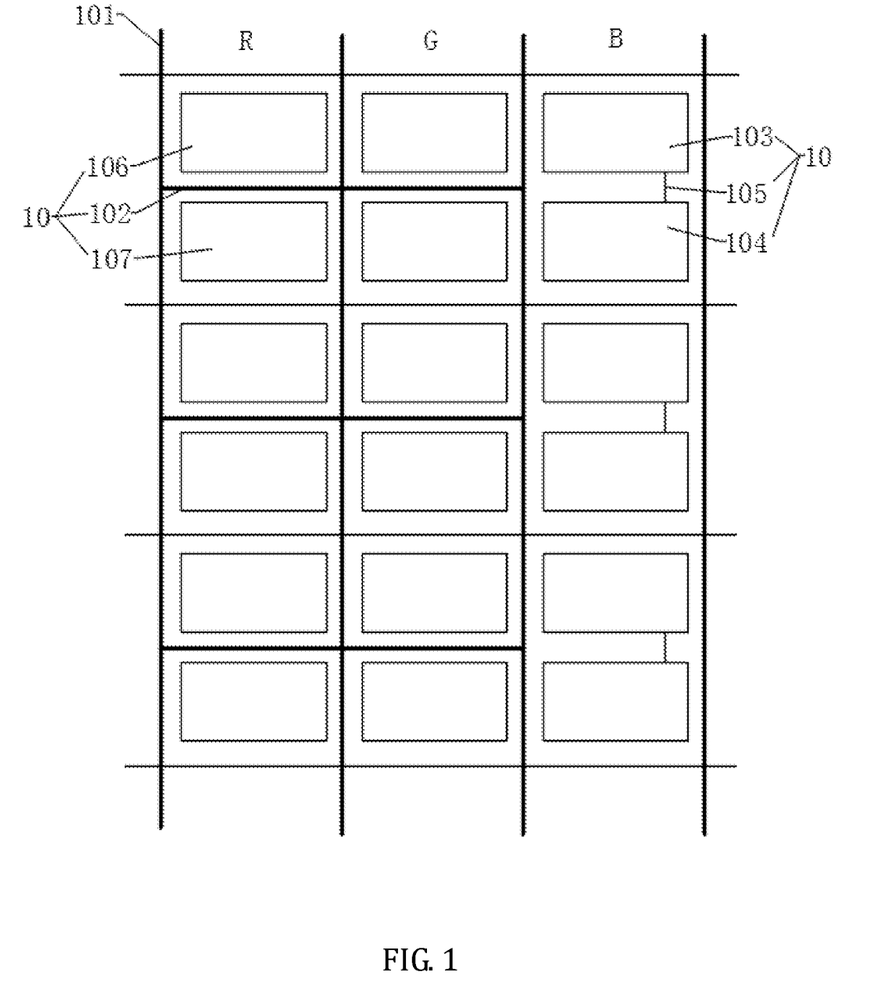
FIG. 1 is a schematic view illustrating a conventional array substrate.

A light-shielding electrode line of a DBS pixel in the vertical direction inside a display area provides an effect of shielding light. Reference being had to FIG. 1, light-shielding electrodes 101 in the horizontal direction are connected to light-shielding electrode lines 102 to form a web structure, so as to ensure signal stability of the light-shielding electrode lines 102. However, to ensure stable connection between a primary common electrode 103 and a secondary common electrode 104 in a pixel 10, it is common to have the primary common electrode 103 and the secondary common electrode 104 of a blue sub-pixel area (B) connected together through a connection electrode 105. In such a structural arrangement, signal stability of the light-shielding line in the blue sub-pixel area cannot be guaranteed with a light-shielding electrode 24 in the horizontal direction. On the other hand, in a red sub-pixel area (R) and a green sub-pixel area (G), the primary common electrode 106 and the secondary common electrode 107 are provided therebetween with a light-shielding electrode 101 extending in the horizontal direction and connected to vertical light-shielding lines 102 located on two sides of the pixel 10. As such, the structure of blue sub-pixel area is different from the structures of the red sub-pixel area and the green sub-pixel and this readily leads to displaying abnormality in displaying a pure blue image, a pure yellow image, or other special images.

SUMMARY OF THE INVENTION

An objective of the present invention is to provide an array substrate, which helps improve phenomena of displaying abnormality for pure blue images, pure yellow images, and other special images.

Another objective of the present invention is to provide a display panel that involves the above array substrate.

To achieve the above objectives, embodiments of the present invention provide the following technical solutions:

In one aspect, an array substrate is provided, comprising multiple gate lines, multiple data lines, and multiple light-shielding electrode lines, the multiple gate lines and the multiple data lines intersecting each other to circumferentially delimit a plurality of sub pixels, the multiple light-shielding electrode lines being arranged to correspond to the multiple data lines, the plurality of sub pixels comprises a blue sub pixel column corresponding to a blue color filter, at least one sub pixel of the blue sub pixel column comprising a light-shielding electrode, the light-shielding electrode being connected to ones of light-shielding electrode lines that are located on two opposite sides of the blue sub pixel column.

In the above array substrate, the sub pixel that comprises the light-shielding electrode is a first sub pixel, the blue sub pixel column further comprising at least one second sub pixel, the second sub pixel comprising a primary common electrode, a secondary common electrode, and a connection electrode connected between the primary common electrode and the secondary common electrode.

In the above array substrate, the first sub pixel and the second sub pixel of the blue sub pixel column are arranged to stagger with respect to each other.

In the above array substrate, a number of the second sub pixels of the blue sub pixel column is smaller than a number of the first sub pixels.

In the above array substrate, the plurality of sub pixels further comprise a red sub pixel column corresponding to a red color filter, the red sub pixel column comprising at least one first sub pixel.

In the above array substrate, the red sub pixel column further comprises at least one second sub pixel, the first sub pixel and the second sub pixel of the red sub pixel column being arranged to stagger with respect to each other.

In the above array substrate, the plurality of sub pixels further comprise a green sub pixel column corresponding to a green color filter, the green sub pixel column comprising at least one first sub pixel.

In the above array substrate, the green sub pixel column further comprises at least one second sub pixel, the first sub pixel and the second sub pixel of the green sub pixel column being arranged to stagger with respect to each other.

In the above array substrate, the plurality of sub pixels comprises at least one 3×3 sub pixel array, each of columns of the sub pixels of the 3×3 sub pixel array comprising a first sub pixel and two second sub pixels, the first sub pixels of different ones of the columns being arranged in staggered rows.

In another aspect, a display panel is provided, comprising the above-described array substrate.

The embodiments of the present invention provide the following advantages or beneficial effects:

In the embodiments of the present invention, since at least one sub pixel of a blue sub pixel column comprises a light-shielding electrode and the light-shielding electrode is connected to light-shielding electrode lines that are located on two opposite sides of the blue sub pixel column, it is possible to prevent signal instability of the light-shielding electrode lines resulting from the blue sub pixel column not including a structural arrangement of the sub pixels that include a light-shielding electrode connected with adjacent light-shielding electrode lines, so that the array substrate and the display panel could demonstrate relatively high contrast. Also, since it is also possible to avoid the phenomenon that a difference of loading signals is excessively large resulting from an excessively significant structure difference between the blue sub pixel column and other columns of the sub pixels so as to prevent displaying abnormality in displaying pure blue and pure yellow images and other special images.

BRIEF DESCRIPTION OF THE DRAWINGS

To more clearly explain the technical solution proposed in an embodiment of the present invention and that of the prior art, a brief description of the drawings that are necessary for describing the embodiment or the prior art is given as follows. It is obvious that the drawings that will be described below show only some embodiments of this application. For those having ordinary skills of the art, other obvious variations may be readily available from these attached drawings without the expense of creative effort and endeavor.

DETAILED DESCRIPTION OF THE PREFERRED EMBODIMENTS

A clear and complete description will be given to technical solutions provided in embodiments of the present invention, with reference being had to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

In addition, the description given below for each embodiment is made with reference to the attached drawings to exemplify specific embodiments that the present invention may be put into practice. Direction related terminology used in the present invention, such as "up", "down", "front", "rear", "left", "right", "internal", "external", and "lateral", is provided as direction defined in the drawing sheets. Thus, using the direction related terminology, which is for better and more clearly describing and understanding of the present invention and is not for indicating or implying any specific orientation that a device or an element described must take or the device or element must be structured or operated at a specific orientation, should thus be appreciated as not imposing constraints to the present invention.

In the description of the present invention, it should be noted that unless specifically required and set, the terms "installation", "connection", and "jointing" used herein should be interpreted in a broad way, such as being fixedly connected or removably connected, or integrally connected; or being mechanically connected; or being directly connected, or indirectly connected with intervening media therebetween, or interiors of two element being in communication with each other. For those having ordinary skills in the art, the specific meaning of these terms used in the present invention can be appreciated for any actual situations.

Further, in the description of the present invention, unless stated otherwise, "multiple" means two or more than two. Terms related to "operations", if used in this specification, should means independent operations and for cases where distinction from other operations, any operation that achieve a desired effect of the operation is included in the terms so used. Further, the symbol "-" as used in this specification stands for a numeral range, which comprises a range of which the minimum and the maximum are respectively the figures set in front of and behind "-". In the drawings, units having similar or the same structure are designated with the same reference numerals.

Figure 2:
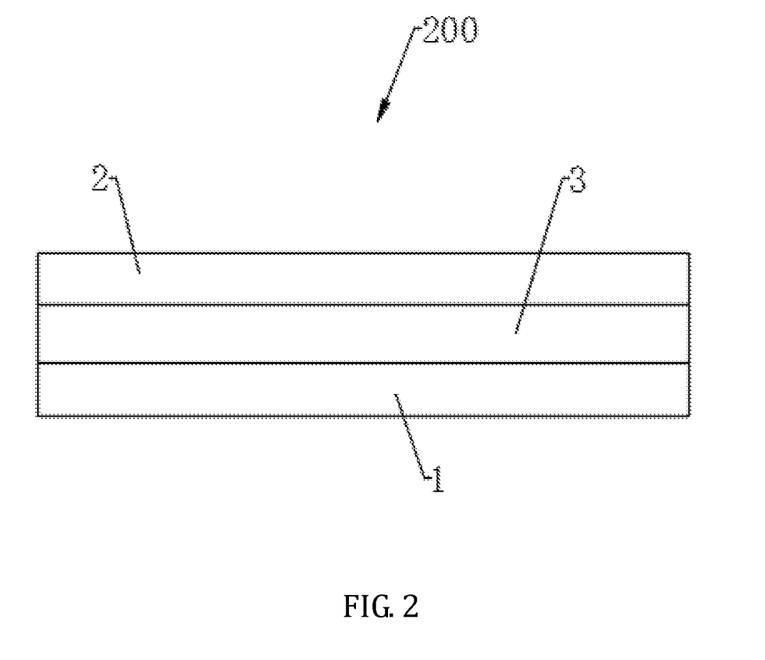
FIG. 2 is a schematic view illustrating a structure of a display panel provided in an embodiment of the present invention.

Referring to FIG. 2, the present invention provides, in an embodiment, a display panel 200. The display panel 200 is applicable to various display devices. The display panel 200 comprises an array substrate 1 and a color filter substrate 2 that are arranged opposite to each other and a liquid crystal layer 3 arranged between the array substrate 1 and the color filter substrate 2. It is appreciated that the display panel 200 of this invention is applicable to electronic devices having a displaying function, such as a mobile phone, a tablet computer, a television, a notebook computer, a digital picture frame, and a navigation device.

Figure 3:
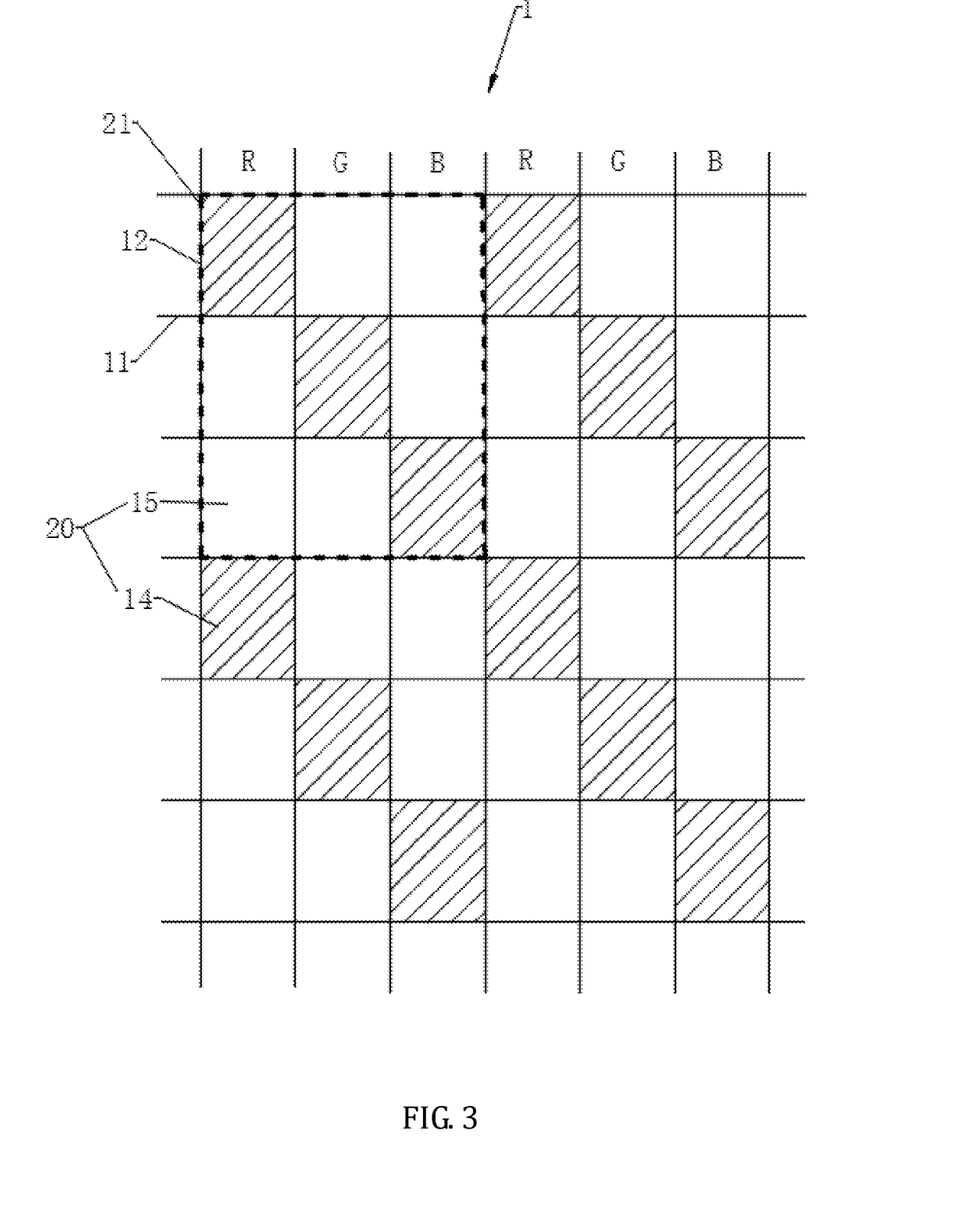
FIG. 3 is a schematic view illustrating an embodiment of an array substrate shown in FIG. 2.
Figure 4:
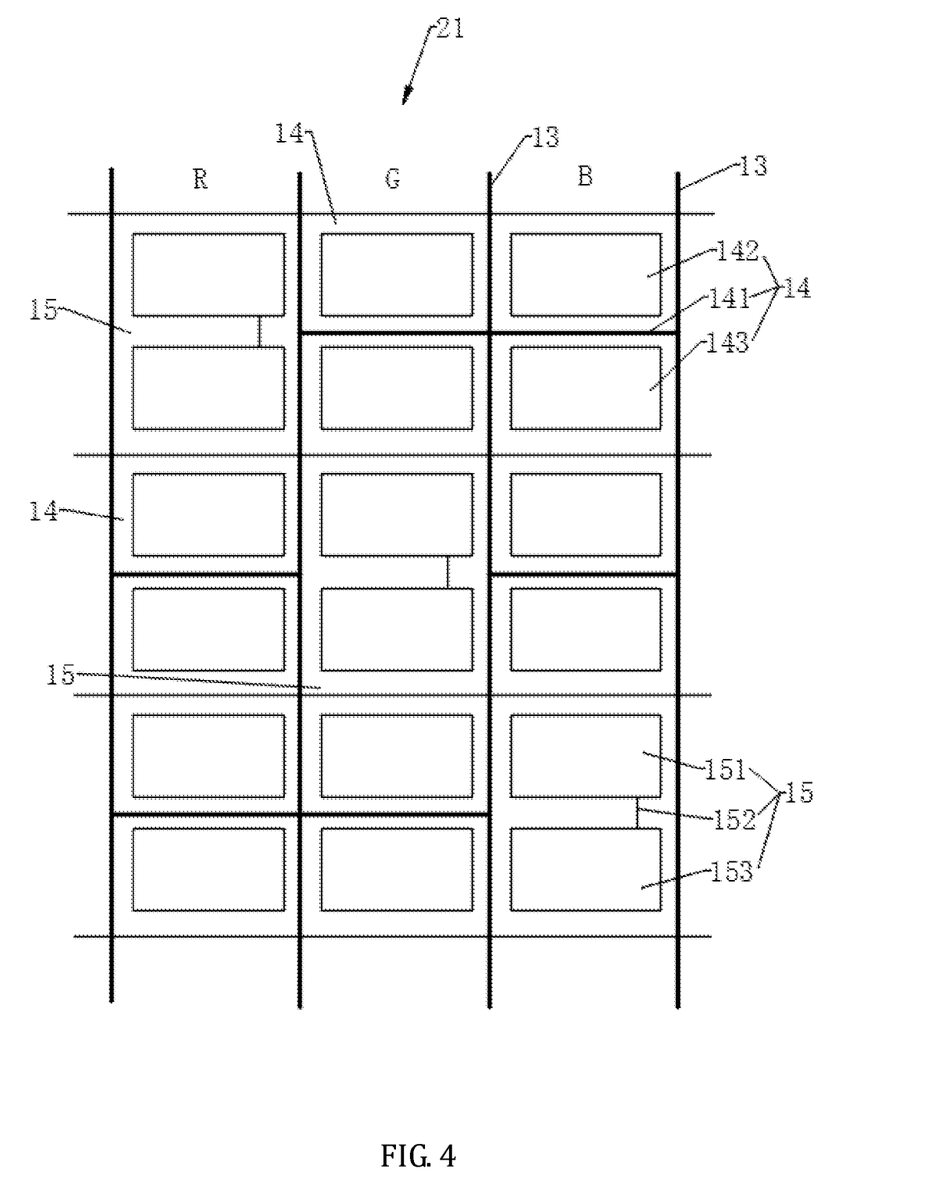
FIG. 4 is a schematic view, in an enlarged form, illustrating a structure of a 3×3 sub pixel array shown in FIG. 3.

Referring collectively to FIGS. 2-4, FIG. 2 is a schematic view illustrating an array substrate 1 according to an embodiment of the present invention. The array substrate 1 of the present invention comprises multiple gate lines 11, multiple data lines 12, and multiple light-shielding electrode lines 13. The multiple gate lines 11 and the multiple data lines 12 intersect each other to circumferentially delimit a plurality of sub pixels 20. The plurality of sub pixels 20 are arranged in an array so as to form a sub pixel array. Specifically, the multiple gate lines 11 extend in a horizontal direction (which is a row-wise direction of the sub pixel array) and the multiple data lines 12 extend in a vertical direction (which is a column-wise direction of the sub pixel array). The multiple light-shielding electrode lines 13 are arranged to correspond to the multiple data lines 12 (wherein FIG. 3 illustrates only the light-shielding electrode lines 13). The multiple light-shielding electrode lines 13 and the multiple data lines 12 correspond to each other in a one-to-one manner and each of the light-shielding electrode lines 13 shields light for the one of the data lines 12 corresponding thereto. It is appreciated that among the plurality of sub pixels 20, each of columns of the sub pixels 20 is disposed between two adjacent ones of the light-shielding electrode lines 13.

The plurality of sub pixels 20 comprise a blue sub pixel column B that corresponds to a blue color filter. The blue sub pixel column B extends in the column-wise direction of the sub pixel array. At least one sub pixel 20 of the blue sub pixel column B comprises a light-shielding electrode 141. The light-shielding electrode 141 is connected to light-shielding electrode lines 13 that are located on two opposite sides of the blue sub pixel column B. The light-shielding electrode 141 extends in the row-wise direction of the sub pixel array.

In the instant embodiment, since at least one sub pixel 20 of the blue sub pixel column B comprises the light-shielding electrode 141 and the light-shielding electrode 141 is connected to the light-shielding electrode lines 13 that are located on two opposite sides of the blue sub pixel column B, it is possible to prevent signal instability of the light-shielding electrode lines 13 resulting from the blue sub pixel column B not including a structural arrangement of the sub pixels 20 that include a light-shielding electrode 141 connected with adjacent light-shielding electrode lines 13, so that the array substrate 1 and the display panel 200 could demonstrate relatively high contrast. Also, since it is also possible to avoid the phenomenon that a difference of loading signals is excessively large resulting from an excessively significant structure difference between the blue sub pixel column B and other columns of the sub pixels 20 so as to prevent displaying abnormality in displaying pure blue and pure yellow images and other special images.

Optionally, the sub pixel 20 that includes the light-shielding electrode 141 is referred to as a first sub pixel 14.

The light-shielding electrode 141 is located between a main common electrode 142 and a sub common electrode 143 of the first sub pixel 14. The blue sub pixel column B further comprises at least one second sub pixel 15. The second sub pixel 15 comprises a primary common electrode 151, a secondary common electrode 152, and a connection electrode 153 connected between the primary common electrode 151 and the secondary common electrode 152.

In the instant embodiment, since the connection electrode 153 is connected between the primary common electrode 151 and the secondary common electrode 152, stability of the primary common electrode 151 and the secondary common electrode 152 can be improved, meaning signal stability of the array common electrode of the array substrate 1 can be enhanced to prevent inducing image sticking by signal instability of the array common electrode that affects product quality. The blue sub pixel column B comprises both the first sub pixel 14 and the second sub pixel 15, so that it is possible to simultaneously ensure signal stability of the light-shielding electrode lines 13 and signal stability of the array common electrode, thereby achieving good displaying quality of the array substrate 1 and the display panel 200.

Optionally, multiple first sub pixels 14 and multiple second sub pixels 15 are arranged to stagger with each other in the blue sub pixel column B. In other words, the first sub pixels 14 are arranged, at interval, in the plurality of second sub pixels 15. Preferably, the number of the second sub pixels 15 of the blue sub pixel column B is less than the number of the first sub pixels 14 involved. The plurality of second sub pixels 15 are evenly arranged, at a fixed interval, among the first sub pixels 14.

Referring to FIGS. 3 and 4, as an optional embodiment, the plurality of sub pixels 20 further comprise a red sub pixel column R that corresponds to a red color filter. The red sub pixel column R comprises at least one first sub pixel 14. Since the red sub pixel column R comprises at least one first sub pixel 14, it is possible to prevent signal instability of the light-shielding electrode lines 13 resulting from the red sub pixel column R not including a structural arrangement of the sub pixels 20 that includes a light-shielding electrode 141 connected with adjacent light-shielding electrode lines 13, so that the array substrate 1 and the display panel 200 could demonstrate relatively high contrast.

The red sub pixel column R further comprises at least one second sub pixel 15. Multiple second sub pixels 15 and multiple first sub pixels 14 are arranged to stagger with each other in the red sub pixel column R. The red sub pixel column R comprises both the first sub pixel 14 and the second sub pixel 15, so that it is possible to simultaneously ensure signal stability of the light-shielding electrode lines 13 and signal stability of the array common electrode, thereby achieving good displaying quality of the array substrate 1 and the display panel 200.

Optionally, the first sub pixels 14 and the second sub pixels 15 are arranged to stagger with each other in the red sub pixel column R. In other words, the first sub pixels 14 are arranged, at interval, in the plurality of second sub pixels 15. Preferably, the number of the second sub pixels 15 of the red sub pixel column R is less than the number of the first sub pixels 14 involved. The plurality of second sub pixels 15 are evenly arranged, at a fixed interval, among the first sub pixels 14.

Of course, in other embodiments, the red sub pixel column R may comprise only the second sub pixel 15 and no first sub pixel 14 is involved.

Referring to FIGS. 3 and 4, as an optional embodiment, the plurality of sub pixels 20 further comprise a green sub pixel column G that corresponds to a green color filter. The green sub pixel column G comprises at least one first sub pixel 14. Since the green sub pixel column G comprises at least one first sub pixel 14, it is possible to prevent signal instability of the light-shielding electrode lines 13 resulting from the green sub pixel column G not including a structural arrangement of the sub pixels 20 that includes a light-shielding electrode 141 connected with adjacent light-shielding electrode lines 13, so that the array substrate 1 and the display panel 200 could demonstrate relatively high contrast.

The green sub pixel column G further comprises at least one second sub pixel 15. Multiple second sub pixels 15 and multiple first sub pixels 14 are arranged to stagger with each other in the green sub pixel column G. The green sub pixel column G comprises both the first sub pixel 14 and the second sub pixel 15, so that it is possible to simultaneously ensure signal stability of the light-shielding electrode lines 13 and signal stability of the array common electrode, thereby achieving good displaying quality of the array substrate 1 and the display panel 200.

Optionally, the first sub pixels 14 and the second sub pixels 15 are arranged to stagger with each other in the green sub pixel column G. In other words, the first sub pixels 14 are arranged, at interval, in the plurality of second sub pixels 15. Preferably, the number of the second sub pixels 15 of the green sub pixel column G is less than the number of the first sub pixels 14 involved. The plurality of second sub pixels 15 are evenly arranged, at a fixed interval, among the first sub pixels 14.

Of course, in other embodiments, the green sub pixel column G may comprise only the second sub pixel 15 and no first sub pixel 14 is involved.

Referring collectively to FIGS. 3 and 4, as an optional embodiment, the plurality of sub pixels 20 comprises at least one 3×3 sub pixel array 21. It is appreciated that three sub pixels 20 arranged in the same row of the 3×3 sub pixel array 21 collectively define a pixel. In other words, the 3×3 sub pixel array 21 comprises three pixels arranged in a column-wise direction. The sub pixels 20 of each column of the 3×3 sub pixel array 21 comprise a first sub pixel 14 and two second sub pixel 15, and the first sub pixels 14 of different ones of the columns are arranged in staggered rows.

In the instant embodiment, each of the pixels comprises a connection electrode 153 that connects a primary common electrode 151 and a secondary common electrode 152 of the pixel so as to ensure stability of connection between the primary common electrode 151 and the secondary common electrode 152 of each of the pixels and also to prevent the connection electrodes 153 from being concentrated in a specific one of the pixels to magnify the difference of the specific pixel from adjacent pixels and thus, preventing phenomenon of difference of loading delay to thereby better image forming performance of the entire display panel 200 and array substrate 1.

Figure 5:
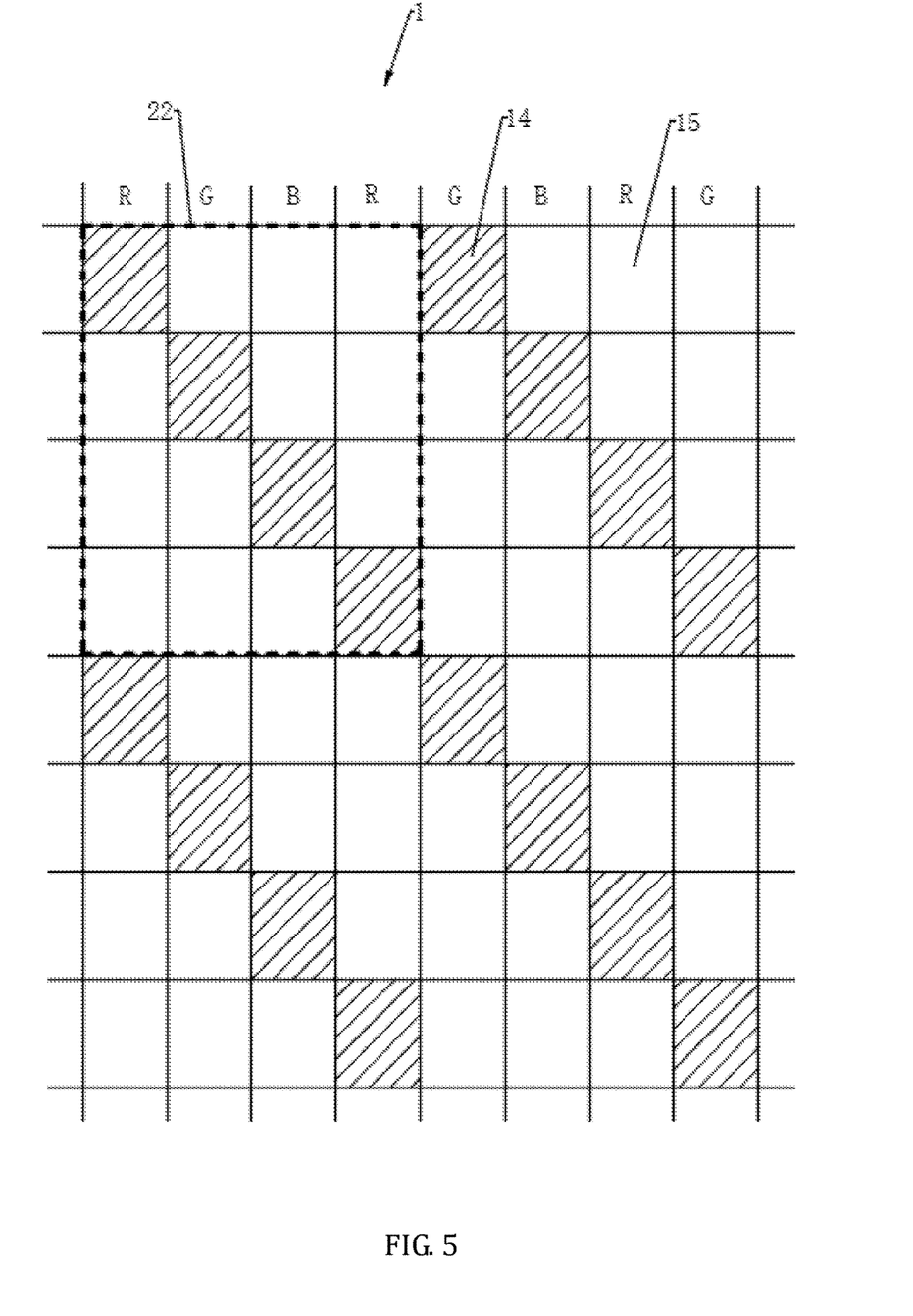
FIG. 5 is a schematic view illustrating another embodiment of the array substrate shown in FIG. 2.

Referring to FIG. 5, in an optional embodiment, the plurality of sub pixels 20 comprises at least one n×n sub pixel array 22, wherein n is not necessarily a multiple of 3 and can be for example 4. The sub pixels 20 of each of columns of the n×n sub pixel array 22 comprises a first sub pixel 14 and the remaining ones of the sub pixels 20 are second sub pixels 15. The first sub pixels 14 of different ones of the columns are arranged in staggered rows.

In the instant embodiment, it is possible to simultaneously ensure the signal stability of the light-shielding electrode lines 13 and the signal stability of the array common electrode so that the array substrate 1 and the display panel

200 may demonstrate excellent displaying quality, and may also prevent the issue of image abnormality in long term displaying resulting from the first sub pixels 14 being concentrated in the sub pixels 20 of the same color, and may also prevent horizontal strips from being induced in long term displaying by having the first sub pixels 14 of the same row concentrated in the sub pixels 20 of the same color.

In the description of the disclosure, the terms "an embodiment", "some embodiments", "an illustrative example", "a specific example", and "some examples" as used herein refer to specific features, structures, materials, or characteristics involved in the embodiment(s) or example(s) are included in at least one embodiment or example of the present invention. In the disclosure, expressions referring to the above mentioned terms may not be referring to the same embodiment or example. Further, the description of the specific features, structures, materials, or characteristics can be combined, through proper arrangements, in any specific one or multiple ones of embodiments or examples.

The embodiments provided above should not be construed as limitations to the protection scope that the technical solutions pursue. Modifications, equivalent substitutes, and improvements made under the spirit and principle of the above embodiments are considered failing within the protection scope of those technical solutions.

What is claimed is:

1. An array substrate, comprising multiple gate lines, multiple data lines, and multiple light-shielding electrode lines, the multiple gate lines and the multiple data lines intersecting each other to circumferentially delimit a plurality of sub pixels, the multiple light-shielding electrode lines being arranged to correspond to the multiple data lines, the plurality of sub pixels comprises a blue sub pixel column corresponding to a blue color filter, at least one sub pixel of the blue sub pixel column comprising a light-shielding electrode, the light-shielding electrode being connected to ones of light-shielding electrode lines that are located on two opposite sides of the blue sub pixel column,
   wherein the sub pixel that comprises the light-shielding electrode is a first sub pixel, the blue sub pixel column further comprising at least one second sub pixel, the second sub pixel comprising a primary common electrode, a secondary common electrode, and a connection electrode connected between the primary common electrode and the secondary common electrode.

2. The array substrate according to claim 1, wherein the first sub pixel and the second sub pixel of the blue sub pixel column are arranged to stagger with respect to each other.

3. The array substrate according to claim 2, wherein a number of the second sub pixels of the blue sub pixel column is smaller than a number of the first sub pixels.

4. The array substrate according to claim 1, wherein the plurality of sub pixels further comprise a red sub pixel column corresponding to a red color filter, the red sub pixel column comprising at least one first sub pixel.

5. The array substrate according to claim 4, wherein the red sub pixel column further comprises at least one second sub pixel, the first sub pixel and the second sub pixel of the red sub pixel column being arranged to stagger with respect to each other.

6. The array substrate according to claim 1, wherein the plurality of sub pixels further comprise a green sub pixel column corresponding to a green color filter, the green sub pixel column comprising at least one first sub pixel.

7. The array substrate according to claim 6, wherein the green sub pixel column further comprises at least one second sub pixel, the first sub pixel and the second sub pixel of the green sub pixel column being arranged to stagger with respect to each other.

8. The array substrate according to claim 1, herein the plurality of sub pixels comprises at least one 3×3 sub pixel array, each of columns of the sub pixels of the 3×3 sub pixel array comprising a first sub pixel and two second sub pixels, the first sub pixels of different ones of the columns being arranged in staggered rows.

9. The array substrate according to claim 3, wherein the plurality of sub pixels comprises at least one 3×3 sub pixel array, each of columns of the sub pixels of the 3×3 sub pixel array comprising a first sub pixel and two second sub pixels, the first sub pixels of different ones of the columns being arranged in staggered rows.

10. A display panel, comprising an array substrate, the array substrate comprising multiple gate lines, multiple data lines, and multiple light-shielding electrode lines, the multiple gate lines and the multiple data lines intersecting each other to circumferentially delimit a plurality of sub pixels, the multiple light-shielding electrode lines being arranged to correspond to the multiple data lines, the plurality of sub pixels comprises a blue sub pixel column corresponding to a blue color filter, at least one sub pixel of the blue sub pixel column comprising a light-shielding electrode, the light-shielding electrode being connected to ones of light-shielding electrode lines that are located on two opposite sides of the blue sub pixel column,
    wherein the sub pixel that comprises the light-shielding electrode is a first sub pixel, the blue sub pixel column further comprising at least one second sub pixel, the second sub pixel comprising a primary common electrode, a secondary common electrode, and a connection electrode connected between the primary common electrode and the secondary common electrode.

11. The display panel according to claim 10, wherein the first sub pixel and the second sub pixel of the blue sub pixel column are arranged to stagger with respect to each other.

12. The display panel according to claim 11, wherein a number of the second sub pixels of the blue sub pixel column is smaller than a number of the first sub pixels.

13. The display panel according to claim 10, wherein the plurality of sub pixels further comprise a red sub pixel column corresponding to a red color filter, the red sub pixel column comprising at least one first sub pixel.

14. The display panel according to claim 13, wherein the red sub pixel column further comprises at least one second sub pixel, the first sub pixel and the second sub pixel of the red sub pixel column being arranged to stagger with respect to each other.

15. The display panel according to claim 10, wherein the plurality of sub pixels further comprise a green sub pixel column corresponding to a green color filter, the green sub pixel column comprising at least one first sub pixel.

16. The display panel according to claim 15, wherein the green sub pixel column further comprises at least one second sub pixel, the first sub pixel and the second sub pixel of the green sub pixel column being arranged to stagger with respect to each other.

17. The display panel according to claim 10, wherein the plurality of sub pixels comprises at least one 3×3 sub pixel array, each of columns of the sub pixels of the 3×3 sub pixel array comprising a first sub pixel and two second sub pixels, the first sub pixels of different ones of the columns being arranged in staggered rows.

18. The display panel according to claim 12, wherein the plurality of sub pixels comprises at least one 3×3 sub pixel array, each of columns of the sub pixels of the 3×3 sub pixel array comprising a first sub pixel and two second sub pixels, the first sub pixels of different ones of the columns being arranged in staggered rows.

* * * * *